(12) United States Patent
Tsorng et al.

(10) Patent No.: US 11,740,667 B2
(45) Date of Patent: Aug. 29, 2023

(54) LATCH MECHANISM FOR SECURING AN EXPANSION CARD MODULE IN A COMPUTER CHASSIS

(71) Applicant: QUANTA COMPUTER INC., Taoyuan (TW)

(72) Inventors: Yaw-Tzorng Tsorng, Taoyuan (TW); Tung-Hsien Wu, Taoyuan (TW); Shin-Ming Su, Taoyuan (TW); Hsiang-Pu Ni, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/369,548

(22) Filed: Jul. 7, 2021

(65) Prior Publication Data
US 2023/0009926 A1    Jan. 12, 2023

(51) Int. Cl.
*G06F 1/18* (2006.01)
*H05K 5/02* (2006.01)
*H05K 7/14* (2006.01)

(52) U.S. Cl.
CPC ........... *G06F 1/186* (2013.01); *H05K 5/0221* (2013.01); *H05K 7/1405* (2013.01); *H05K 7/1409* (2013.01)

(58) Field of Classification Search
CPC .. H05K 7/1409; H05K 7/1405; H05K 5/0221; G06F 1/185; G06F 1/186
See application file for complete search history.

(56) References Cited

U.S. PATENT DOCUMENTS

| | | | |
|---|---|---|---|
| 6,904,606 B2* | 6/2005 | Inoue | G11B 33/027 720/646 |
| 8,437,139 B2* | 5/2013 | Peng | G06F 1/185 361/810 |
| 11,147,183 B2* | 10/2021 | Tsorng | H05K 7/1411 |
| 2021/0091489 A1* | 3/2021 | Wang | H01R 12/7058 |

* cited by examiner

*Primary Examiner* — James Wu
(74) *Attorney, Agent, or Firm* — Nixon Peabody LLP

(57) ABSTRACT

A latch mechanism for securing an expansion card assembly in a computer chassis includes a lever, a stop member, a rotary latch, a first biasing structure, and a second biasing structure. The lever includes a latching end and an opposing pinned end. The stop member extends from the pinned end. The rotary latch is connected to the latching end and includes a receiving chamber and a hook structure. The hook structure includes a notch for receiving a stop pin. The first biasing structure extends from the lever into the receiving chamber and is configured to urge the rotary latch into a locked position. The second biasing structure is configured to urge the lever about the pinned end to an open position.

20 Claims, 10 Drawing Sheets

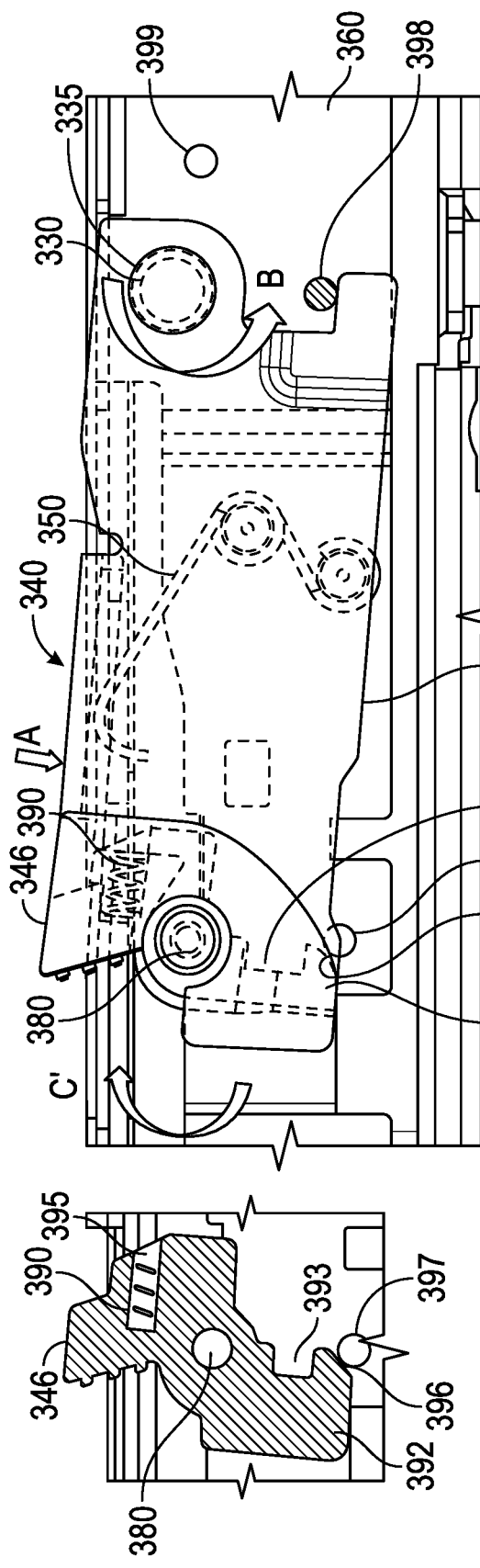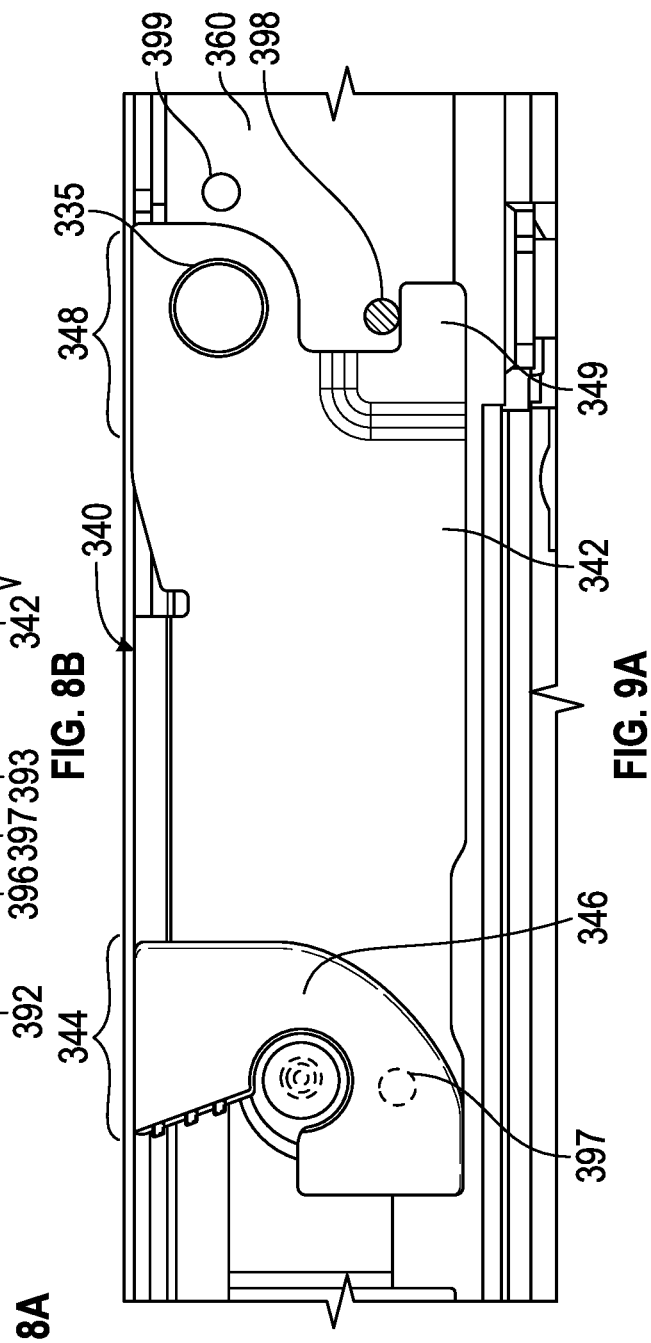

LATCH MECHANISM FOR SECURING AN EXPANSION CARD MODULE IN A COMPUTER CHASSIS

FIELD OF THE INVENTION

The present invention relates generally to a latch mechanism, and more specifically, to a latch mechanism for securing a printed circuit board module ("PCB") in computer chassis.

BACKGROUND OF THE INVENTION

Expansion cards have common applications in computing systems, such as computing and input/output operations in a server. High quality connections for expansion cards within servers are needed to allow for high performance operations during computing and input/output activities. To provide high quality signals within a server, a vertical expansion card is assembled in a riser module to allow the vertical expansion card to be physically steady and remain operable, when exposed to mechanical shock or vibrations. Expansion cards are typically constrained within a module that is secured to a computer chassis using a screw. However, conventional constraining mechanisms can lead to the connectors on an expansion card to wear prematurely causing signal loss, for example, at the riser module slot for a vertical expansion card.

Accordingly, there is a need for improved mechanisms for securing an expansion card module in a computing device to maintain a high quality connection with the expansion card. In addition, there is a need for increasing the efficiency in the building and servicing of expansion cards in computer devices.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a latch mechanism for securing an expansion card assembly in a computer chassis comprises a lever including a latching end and an opposing pinned end. A stop member extends from the pinned end, and a rotary latch is connected to the latching end. The rotary latch includes a receiving chamber and a hook structure. The hook structure includes a notch for receiving a stop pin. A first biasing structure extends from the lever into the receiving chamber. The first biasing structure is configured to urge the rotary latch into a locked position. A second biasing structure is configured to urge the lever about the pinned end to an open position.

In a further aspect of the latch mechanism implementation, the pinned end of the lever is configured to receive a first cylindrical shaft extending from a side structure of the expansion card assembly. The first cylindrical shaft at least partially connects the lever to the side structure. In a further aspect, the lever rotates about the first cylindrical shaft.

In a further aspect of the latch mechanism implementation, the stop member is configured to engage a first stop pin protruding from a side structure of the expansion card assembly. In a further aspect, rotation of the lever about the first cylindrical shaft is at least partially controlled by a second stop pin and a third stop pin protruding from a side structure of the expansion card assembly. In yet a further aspect, the first biasing structure is configured to urge the rotary latch from the unlocked position to the locked position. In a further aspect, the notch is configured to receive the second stop pin. In yet a further aspect, the hook structure includes a chamfered end configured to engage the second stop pin.

In a further aspect of the latch mechanism implementation, the first biasing structure is a coil spring. In a further aspect, the second biasing structure is a torsion spring.

In a further aspect of the latch mechanism implementation, the lever includes an angled portion along a top edge of the lever. The angled portion is in contact with the second biasing structure. In a further aspect, the rotary latch is connected to the lever with a second cylindrical shaft about which the rotary latch rotates.

According to certain aspects of the present disclosure, an expansion card assembly comprises a peripheral frame defining an interior space, a printed circuit board at least partially positioned within the interior space, and a latch mechanism. The latch mechanism includes a lever with a latching end and a pinned end, a stop member extending from the pinned end, and a rotary latch connected to the latching end. The rotary latch includes a receiving chamber and a hook structure. The hook structure includes a notch for receiving a stop pin. A first biasing structure extends from the lever into the receiving chamber. The first biasing structure is configured to urge the rotary latch into a locked position. A second biasing structure is configured to urge the lever about the pinned end to an open position.

In a further aspect of the expansion card assembly implementation, the printed circuit board is a vertical printed circuit board. In a further aspect, the stop member is configured to engage a first stop pin protruding from the peripheral frame. In yet a further aspect, the pinned end of the lever is configured to receive a first cylindrical shaft protruding from the peripheral frame. The first cylindrical shaft at least partially connects the lever to the peripheral frame. In a further aspect, rotation of the lever about the first cylindrical shaft is at least partially controlled by a second stop pin and a third stop pin protruding from the peripheral frame. In a further aspect, the first biasing structure is configured to urge the rotary latch from an unlocked position to the locked position. In yet a further aspect, the notch is configured to receive a second stop pin. In a further aspect, the hook structure includes a chamfered end configured to engage the second stop pin.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The present disclosure, and its advantages, will be better understood from the following description of representative embodiments together with reference to the accompanying drawings. These drawings depict only representative embodiments, and are therefore not to be considered as limitations on the scope of the various embodiments or claims.

FIG. 8A is a cross-sectional side view through the latching end of the latch mechanism from FIG. 6B prior to the latch mechanism locking the expansion card assembly to a computer chassis, according to some implementations of the present disclosure.

FIG. 8B is a side view of the latch mechanism including hidden features prior to the latch mechanism locking the expansion card assembly to a computer chassis, according to some implementations of the present disclosure.

FIG. 9A is a side view of the latch mechanism of FIG. 8B with the latching end and pinned end securing the vertical printed circuit board module to the computer chassis, according to some implementations of the present disclosure.

DETAILED DESCRIPTION

Figure 1:
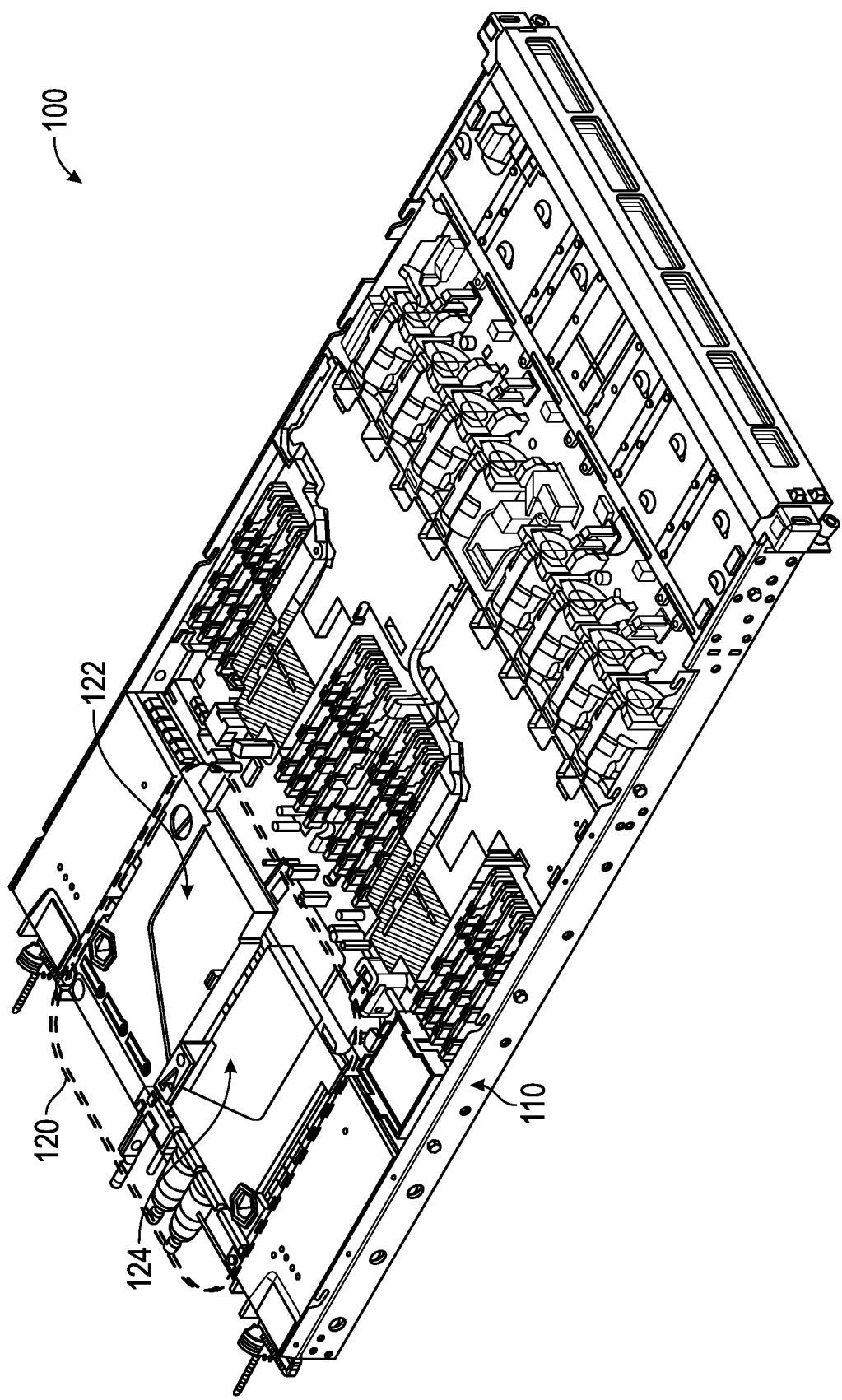
FIG. 1 is a top left interior perspective view of an exemplary server including expansion card assemblies, according to some implementations of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

For the present disclosure, the terms "computer system" or "computer device" or "computing system" refer to any electronically-powered or battery-powered equipment that has hardware, software, and/or firmware components, where the software and/or firmware components can be configured for operating features on the device.

In some implementations, an expansion card assembly, such as a vertical printed circuit board ("PCB") module or other PCB modules, include a peripheral frame or housing having an interior space. The PCB is at least partially positioned within the interior space of the peripheral frame.

In some aspects, it is contemplated that a latch mechanism is connected to or a part of the expansion card assembly. The latch mechanism includes a lever with a latching end and a pinned end, along with a stop member extending from the pinned end. A rotary latch is further connected to the latching end. The rotary latch includes a receiving chamber for receiving a first biasing structure, such as a coil spring. In addition, the rotary latch includes a hook structure with a notch for receiving a stop pin that protrudes from the peripheral frame, such as a side wall. The first biasing structure extends from the lever into the receiving chamber and is configured to urge the rotary latch into a locked position when the notch receives a stop pin. A second biasing structure, such as a torsion spring, is configured to urge the lever away about the pinned end to an unlocked position, such as when the notch of the rotary latch is disengaged from the stop pin.

The present disclosure provides improved flexibility and higher bandwidth for expansion cards, including allowing high quality connections to be maintained by an expansion card installed in a computing device, such as a server. The latch mechanism and expansion card assembly described by the present disclosure are particularly desirable as signal speed and stability needs of computing devices, such as servers, continue to increase. For example, for a vertical printed circuit board ("PCB") module in a 1U server or other high performance computing devices, the latch mechanism of the present disclosure minimizes signal loss resulting from vibrations of the computing device itself or the surrounding environment. The latch mechanism provides multiple points on the expansion card assembly for securing the latch mechanism and further provides an improved manufacturing and maintenance experience when installing and removing an expansion card assembly, such as a vertical PCB module.

Turning now to FIG. 1, a top left interior perspective view of an exemplary computing device 100 is depicted, such as a server. The computing device 100 includes the computer chassis 110 and one or more expansion card assemblies 122, 124 located anywhere within the computer chassis 110, including a location such as the rear portion 120, as depicted in FIG. 1.

Figure 2:
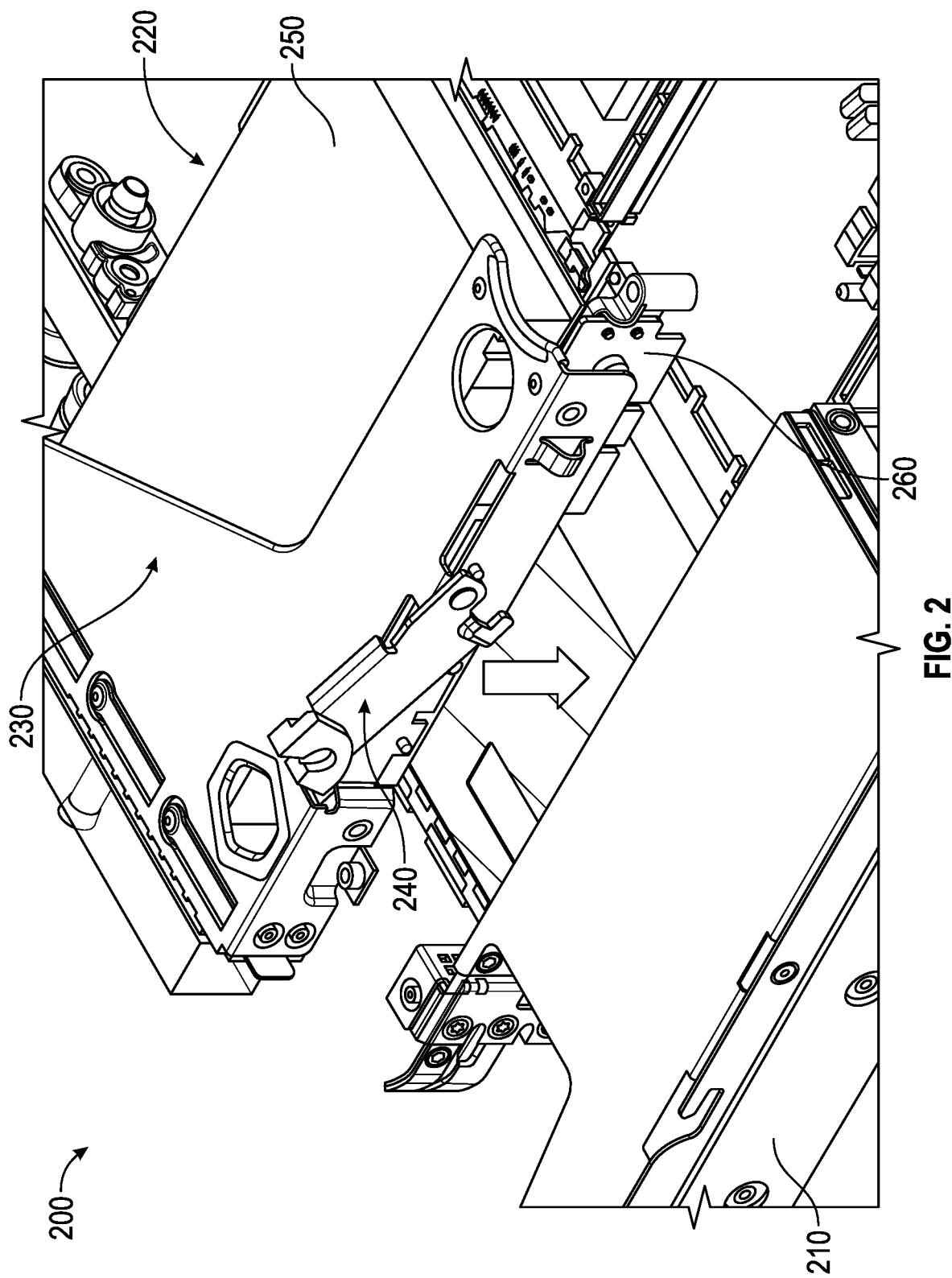
FIG. 2a is top left partial interior perspective view of an expansion card assembly, including vertical printed circuit boards, and a latch mechanism for securing the assembly during placement in a computer chassis of an exemplary server, according to some implementations of the present disclosure.

Referring to FIG. 2, a top left partial interior perspective view of a computing device 200 (e.g., a server) is depicted. The computing device 200 includes an expansion card assembly 220 having a peripheral frame 230 with a latch mechanism 240 connected thereto. The peripheral frame 230 at least partially houses one or more of a horizontal PCB 250 and a vertical PCB 260. As depicted in FIG. 2, the expansion card assembly 220 is being installed into a computer chassis 210 of the computing device 200. The latch mechanism 240 is shown in an open position during the initial placement of the expansion card assembly 220. Once the vertical PCB 260 is installed into, for example, a connector associated with the motherboard (not shown), the installer rotates the latch mechanism 240 in a downward direction as depicted by the arrow. The downward rotation places the latch mechanism 240 in a locked position to secure the expansion card assembly 220 to the computer chassis 210.

Figure 3A:
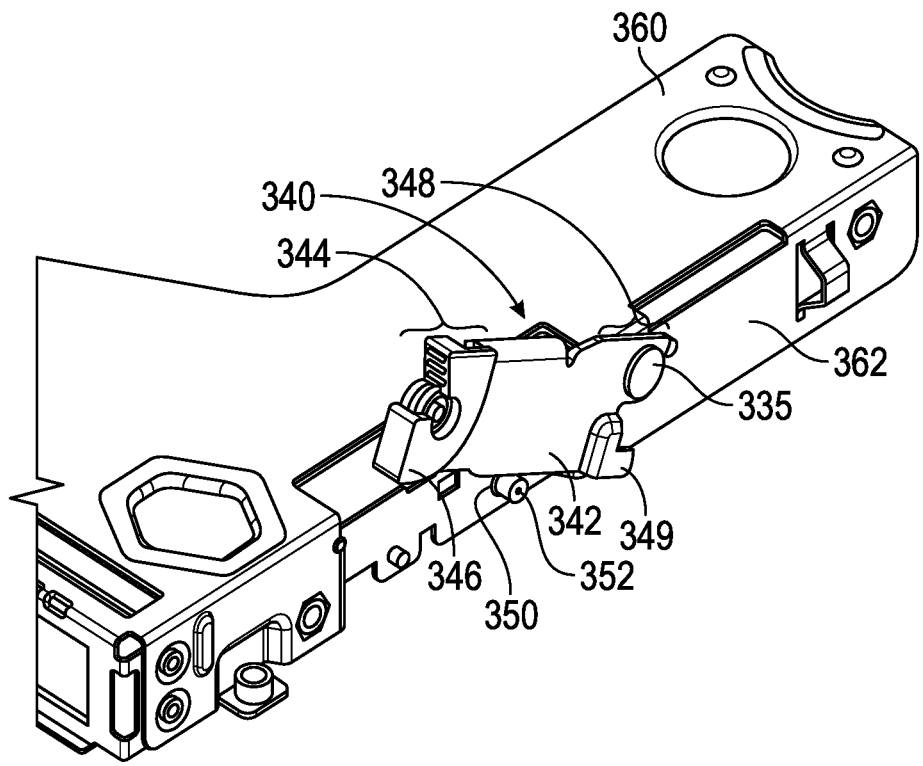
FIGS. 3A and 3B are top right perspective and partially exploded perspective views of a latch mechanism for securing an expansion card assembly to a computer chassis, according to some implementations of the present disclosure.
Figure 3B:
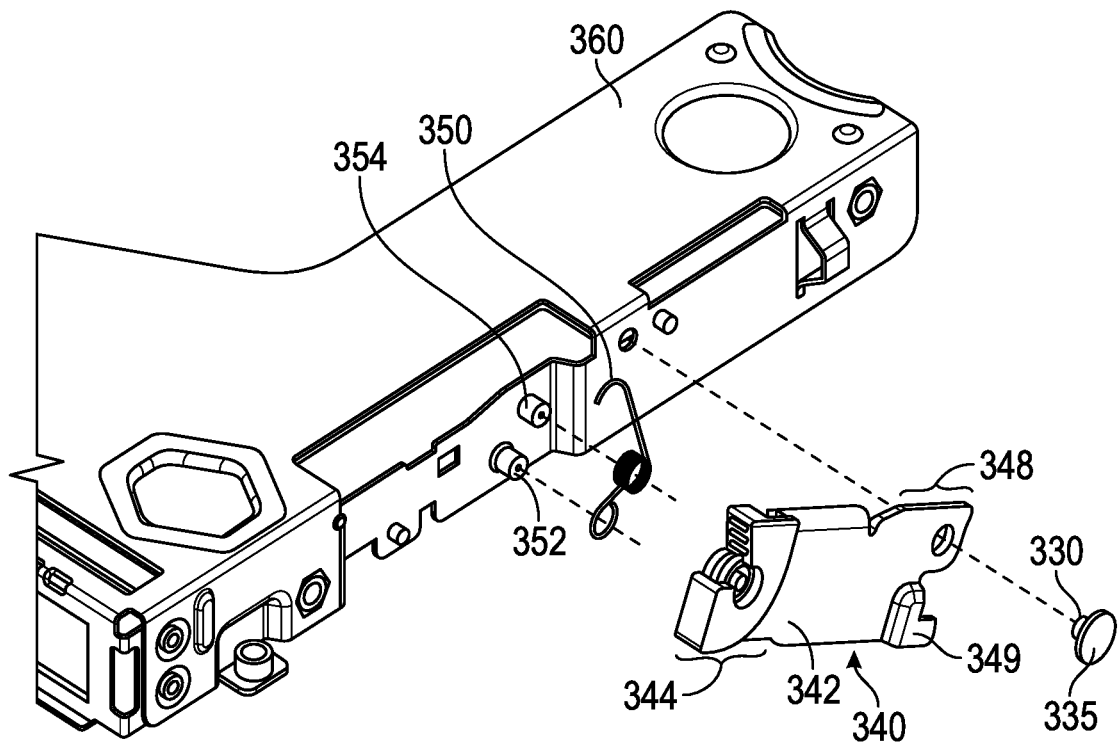

Referring now to FIGS. 3A and 3B, a top right perspective view and a partially exploded perspective view of a latch mechanism 340 is depicted for securing an expansion card assembly to a computer chassis (see FIGS. 1 and 2). The expansion card assembly (see element 220 in FIG. 2) can include a peripheral frame 360 to which the latch mechanism 340 is connected. The latch mechanism 340 is depicted in an open or unlocked position.

The latch mechanism 340 includes a lever 342 having a latching end 344 and a pinned end 348. The latching end 344 includes a rotary latch 346 connected to the lever 342. The pinned end 348 includes a stop member 349 extending from the lever 342. The lever 342 is connected to the peripheral frame 360 at, for example, a side wall 362. A pinned connection may be used including a first cylindrical shaft 330 that extends through the pinned end 348 of the lever 342 and is secured to the side wall 362. A shaft cap 335 can further be used to keep the lever 342 from sliding off the first cylindrical shaft 330. A biasing structure 350 such as, but not limited to, a torsion spring, is disposed between the lever 342 and the side wall 362 of the peripheral frame 360. The biasing structure 350 is supported by fixing pins 352, 354 that protrude from side wall 362.

Figure 4A:
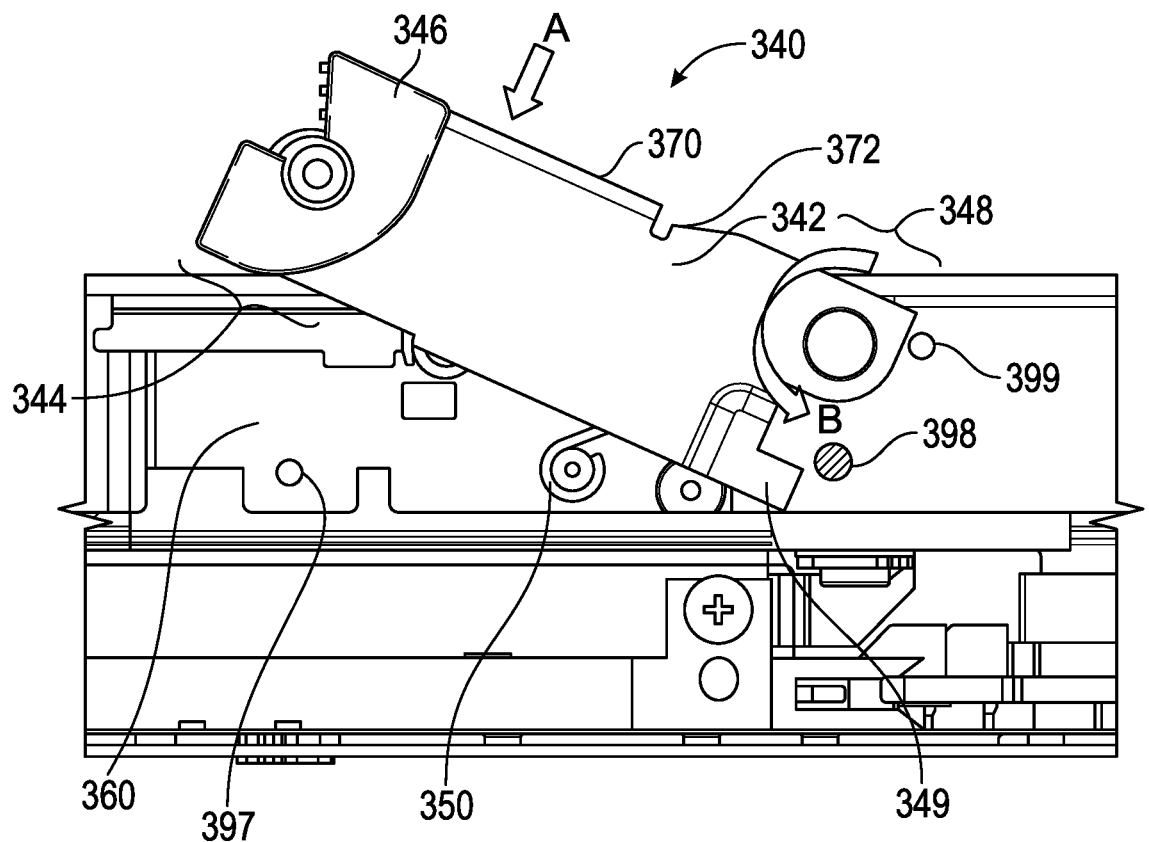
FIG. 4A is a side view of the latch mechanism of FIGS. 3A and 3B for an expansion card assembly transitioning from an open to a locked position, according to some implementations of the present disclosure.
Figure 4B:
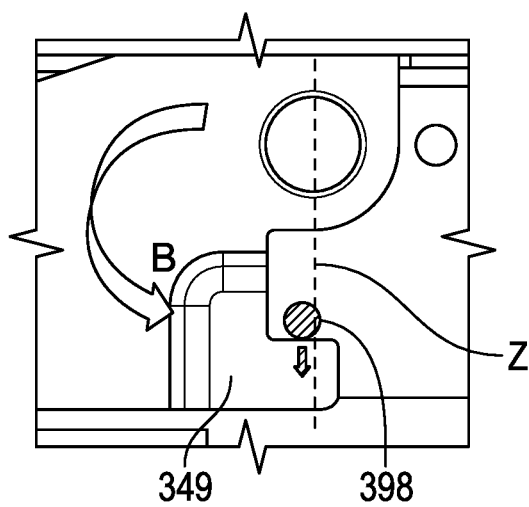
FIG. 4B is a side view of a pinned end of the latch mechanism of FIG. 4A with the latch mechanism in the locked position, according to some implementations of the present disclosure.

Referring now to FIGS. 4A and 4B, a side view is depicted of the latch mechanism 340 of FIGS. 3A and 3B for an expansion card assembly transitioning from an unlocked or open position to a locked position. FIG. 4B depicts a side view of a pinned end 348 of the latch mechanism 340 of FIG. 4A with the latch mechanism 340 in the locked position. The lever 342 includes an angled portion 370 along a top edge 372 of lever 342 that engages with the biasing structure 350.

Lever 342 starts in a fully open position with an edge of the lever 342 at the pinned end 348 resting against a third stop pin 399. In response to urging of the lever 342 in direction A, the lever 342 rotates in direction B from the depicted open position about the pinned end 348 until the rotary latch 346 engages with and is secured about a second stop pin 397 protruding from the peripheral frame 360. When the rotary latch 346 is fully engaged with the second stop pin 397 further rotation of the lever 342 is limited. During rotation of the lever 342 in direction B, the biasing structure 350 compresses and the stop member 349 protruding of the lever 342 engages with a first stop pin 398, that protrudes from a chassis frame 560 (see FIG. 5) adjacent to the peripheral frame 360. Upon full engagement of the stop member 349 with the first stop pin 398, the lever 342 is also limited from moving up or down along the z-axis depicted in FIG. 4B.

Figure 5:
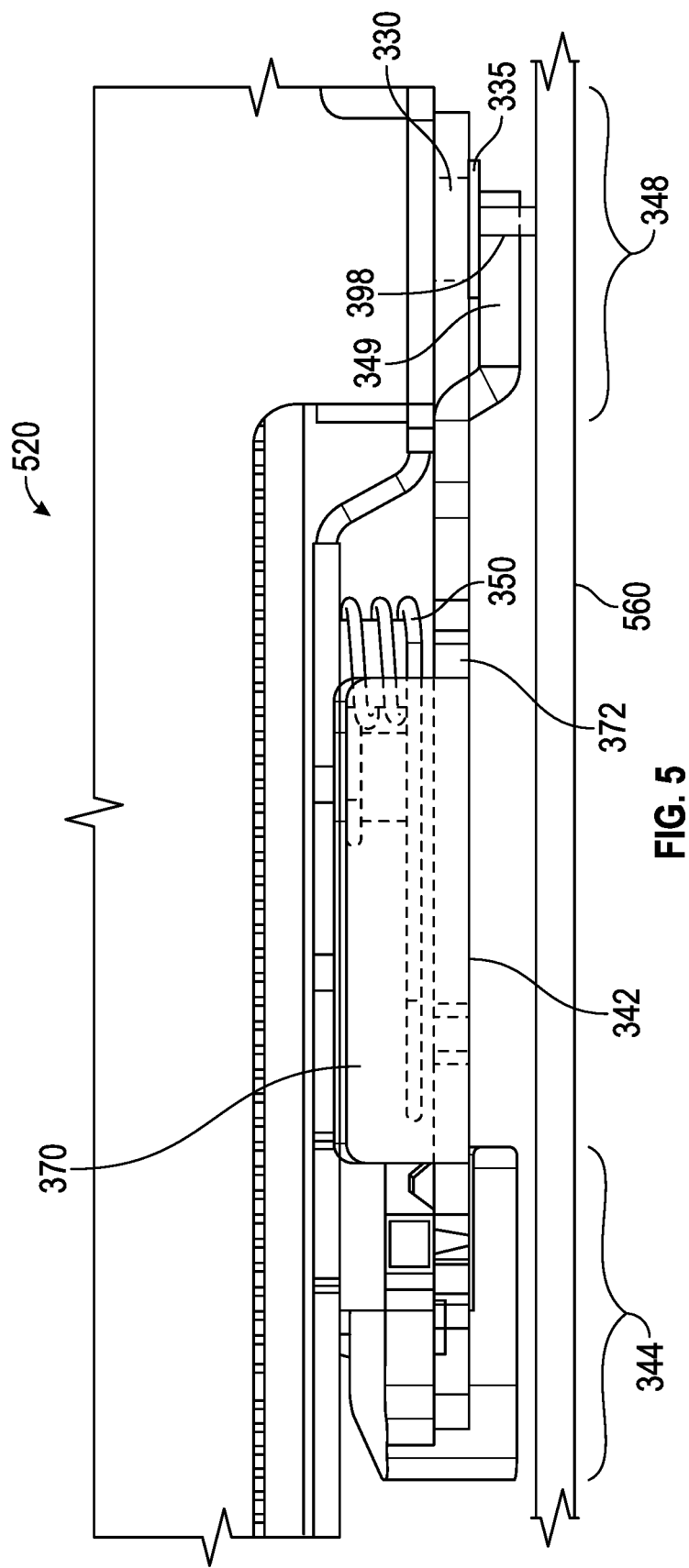
FIG. 5 is a top view of the latch mechanism of FIGS. 4A to 4B connected to the expansion card assembly, according to some implementations of the present disclosure.

Referring to FIG. 5, a top view of the latch mechanism 340 of FIGS. 4A to 4B is depicted as part of an expansion card assembly 520. The biasing structure 350 is shown to be positioned below the angled portion 370 that extends laterally from the top edge 372 of the lever 342 between the latching end 344 and the pinned end 348.

Figure 6A:
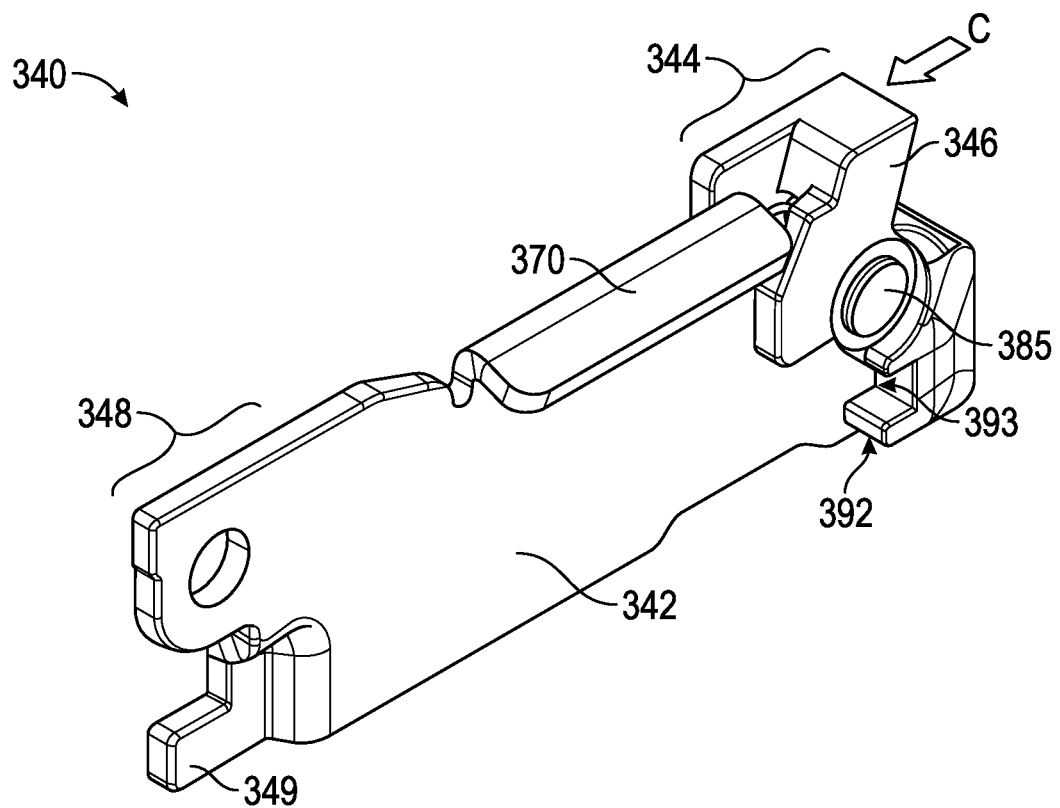
FIGS. 6A and 6B are top right perspective and partial exploded perspective views of the latch mechanism of FIGS. 4A and 4B, according to some implementations of the present disclosure.
Figure 6B:
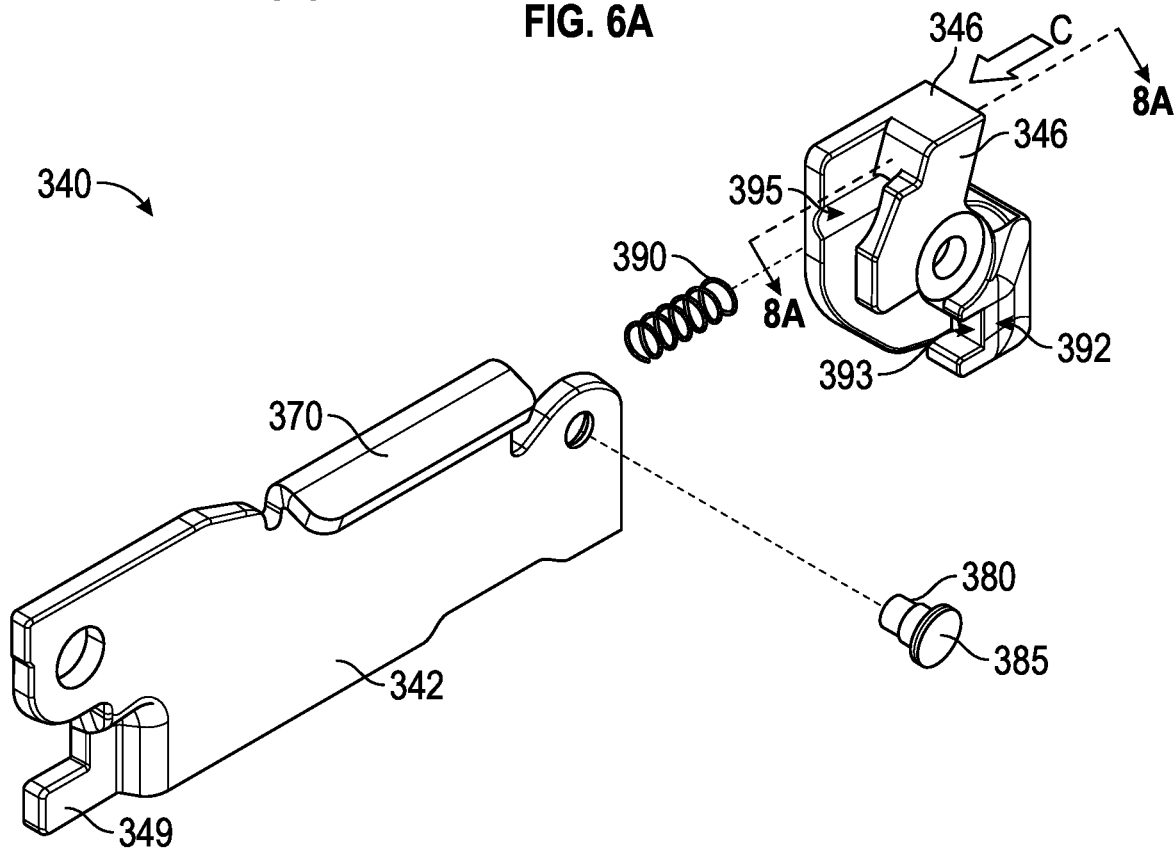

Referring to FIGS. 6A and 6B, a top right perspective view and a partial exploded perspective view of the latch mechanism 340 of FIGS. 4A and 4B is depicted. The view provided is of the opposite side of the latch mechanism 340 depicted in FIGS. 3A-B and 4A-B and includes additional details of the rotary latch 346 at the latching end 344 and the stop member 349 at the pinned end 348 of the lever 342. In some implementations, the stop member 349 is parallel to but laterally offset from the surface of lever 342.

Another biasing structure 390 such as, but not limited to, a coil spring, is positioned between the lever 342 and a receiving chamber 395 of the rotary latch 346. The rotary latch 346 can include a hook structure 392 that defines the boundaries of a notch 393 for receiving a stop pin. The rotary latch 346 is connected to the latching end 344 of the lever 342 using a cylindrical shaft 380 that is secured to the lever 342 on one end and has a shaft cap 385 on the other end. When the rotary latch 346 is urged in direction C, the rotary latch 346 rotates about the cylindrical shaft 380.

Figure 7:
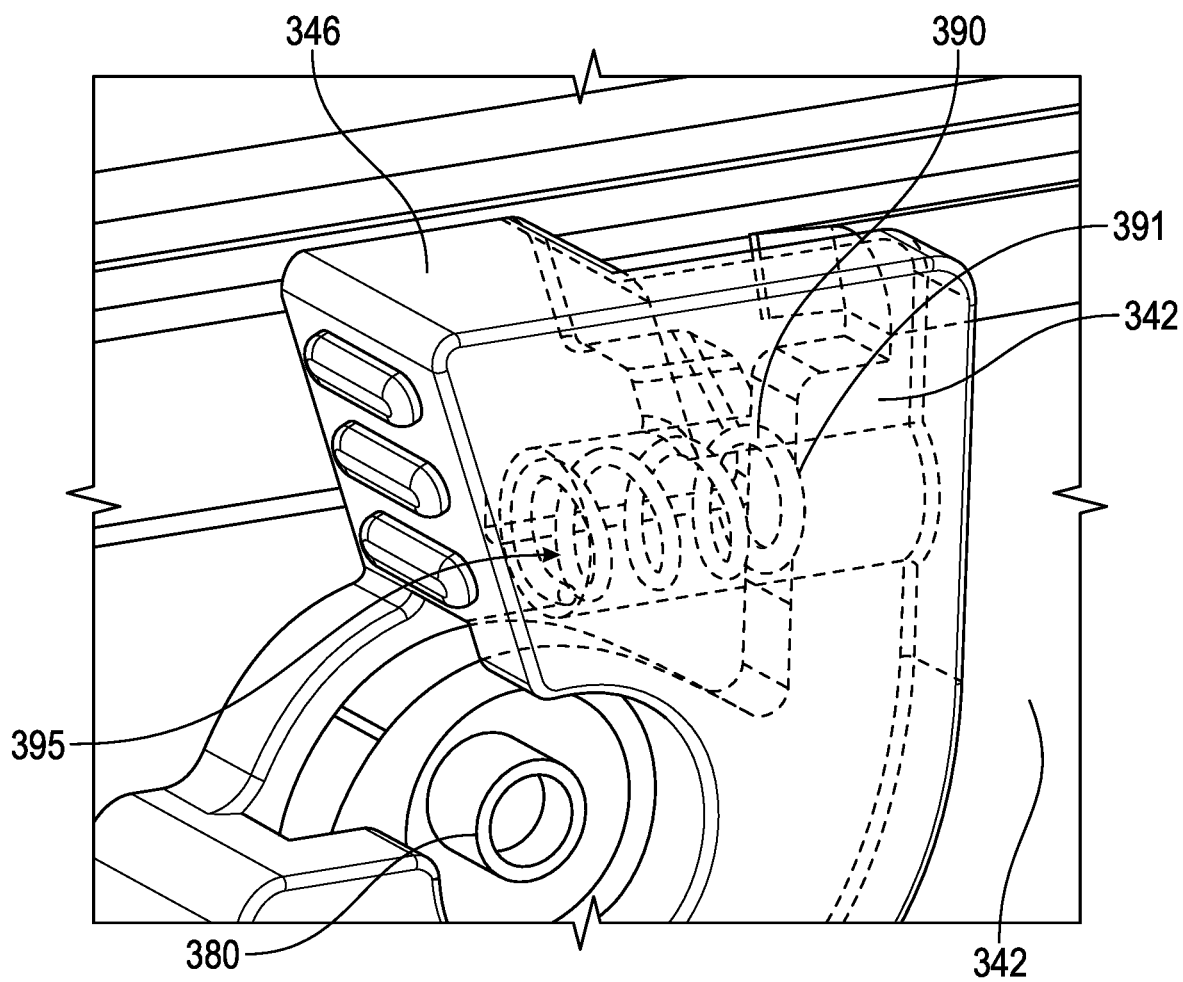
FIG. 7 is a top perspective view of a latching end of the latch mechanism including an interior hidden view of a biasing structure within a rotary latch at the latch end, according to some implementations of the present disclosure.

Referring now to FIG. 7, a top perspective view of a portion of the latching end 344 (see FIGS. 3A, 4A, 5, and 6A) of the latch mechanism 340 in FIGS. 6A and 6B is depicted, including an interior hidden view of the biasing structure 390 within the receiving chamber 395 of the rotary latch 346. As discussed for FIG. 6B, the biasing structure 390 is positioned within and constrained on one end by a receiving chamber 395 of the rotary latch 346 and on the other end by the lever 342 at interface 391. The biasing structure 390 is depicted in a substantially uncompressed state (e.g., with minimal compression; with no compression; with enough compression so that the spring does not move within the receiving chamber 395). As the rotary latch 346 is urged toward the interface 391 causing rotation of the rotary latch 346 about the cylindrical shaft 380, the biasing structure 390 transitions to a compressed state.

Referring now to FIG. 8A, a cross-sectional side view through a portion of the latching end 344 (see FIGS. 3A, 4A, 5, and 6A) of the latch mechanism 340 from FIGS. 6A and 6B is depicted prior to the latch mechanism 340 locking an expansion card assembly to a computer chassis (e.g., see expansion card assembly 220 and computer chassis 210 in FIG. 2). FIG. 8B is a side view of the latch mechanism 340, prior to locking an expansion card assembly to a computer chassis. The latch mechanism 340 as depicted includes hidden features, such as the biasing structures 350, 390, the rotary latch 346, the hook structure 392, and the notch 393.

In response to the urging of the lever 342 in direction A, the lever 342 of the latch mechanism 340 transitions by rotating about the cylindrical shaft 330 in direction B such that the pinned end 348 (see FIGS. 3A, 4A, 5, and 6A) is no longer seated at the third stop pin 399. The rotary latch 346 at the latching end 344 (see FIGS. 3A, 4A, 5, and 6A) includes a chamfered end 396 on hook structure 392 that is in contact with the second stop pin 397. Upon further rotation of the lever 342 in direction B, contact between the chamfered end 396 and the second stop pin 397 causes the rotary latch 346 to rotate about the cylindrical shaft 380 in direction C' until the second stop pin 397 locks into the notch 393 at which point any further rotation in direction B is limited.

As rotary latch 346 rotates in direction C', biasing structure 390 is compressing due to being constrained within receiving chamber 395 on one end of the biasing structure 390 and on the other end by lever 342. Similarly, as the lever 342 continues to rotate in direction B, the other biasing structure 350 also compresses because the biasing structure 350 is configured to urge the lever 342 in a direction causing rotation opposite that of direction B.

Figure 9B:
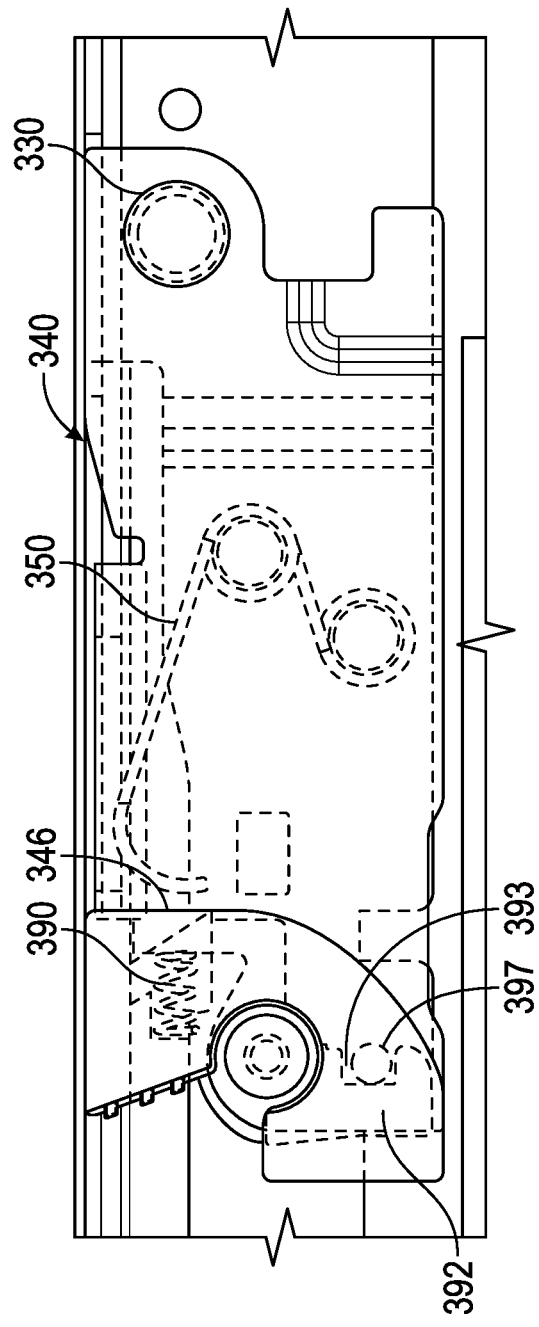
FIG. 9B is the side view of the latch mechanism of FIG. 9A including select hidden features, according to some implementations of the present disclosure.

Referring now to FIG. 9A, a side view of the latch mechanism 340 of FIG. 8B is depicted with the latching end 344 and the pinned end 348 in a locked position to secure the expansion card assembly to the computer chassis (e.g., see expansion card assembly 220 and computer chassis 210 in FIG. 2). FIG. 9B depicts the side view of FIG. 9A, except with hidden features, such as the biasing structure 350, the biasing structure 390, the notch 393, the hook structure 392, the second stop pin 397, and the cylindrical shafts 330, 380 (see FIGS. 9B and 10). As discussed for FIGS. 4A and 4B, during rotation of the lever 342 in direction B, the biasing structure 350 compresses and the stop member 349 protruding for the lever 342 engages with the first stop pin 398 (shown in cross-section with cross-hatching in FIGS. 8B, 9A, and 11), which extends from an adjacent chassis frame 560 (see FIG. 5). Upon full engagement of the stop member 349 with the first stop pin 398, as depicted in FIG. 9A, the latch mechanism 340 has limited movement.

With the latch mechanism 340 constrained from rotation by the second stop pin 397 and further locked by the friction contact between stop member 349 and the first stop pin 398, a vertical PCB 260 (see FIG. 2) that may be a part of an expansion card assembly, is prevented from being dislodged in a vertical direction that could cause a deterioration of a connection, for example, with a motherboard of the computing device 100.

Figure 10:
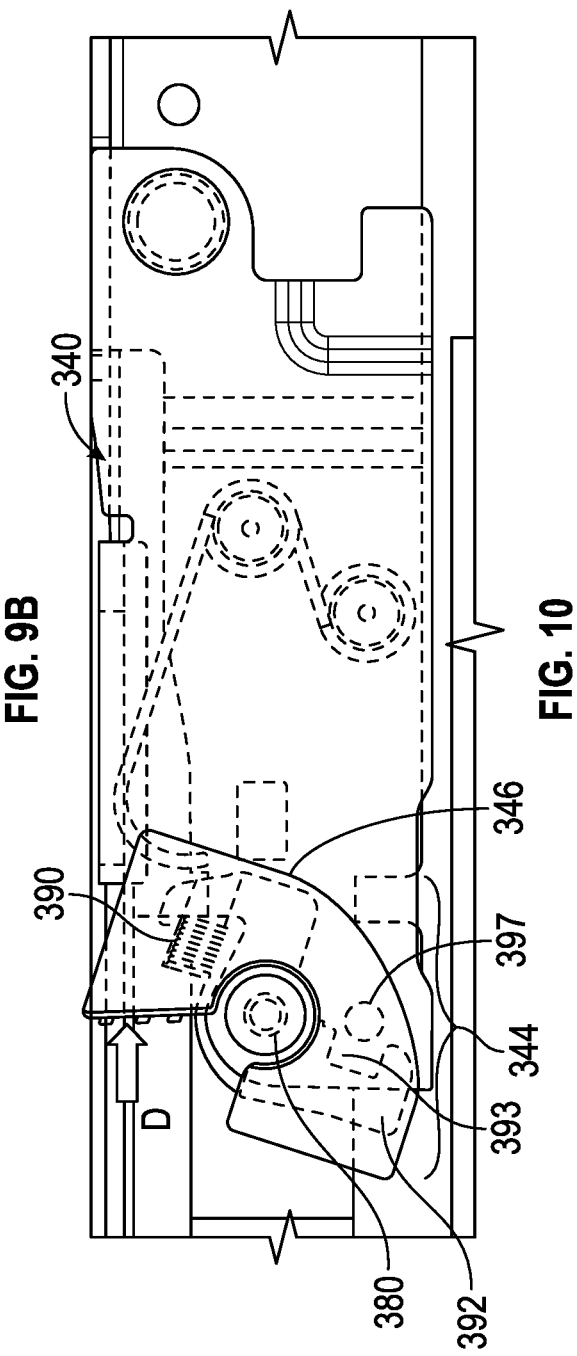
FIG. 10 is the side view of the latch mechanism of FIGS. 9A and 9B, including hidden features, as the rotary latching is unlocked to release the expansion card assembly from the computer chassis, according to some implementations of the present disclosure.
Figure 11:
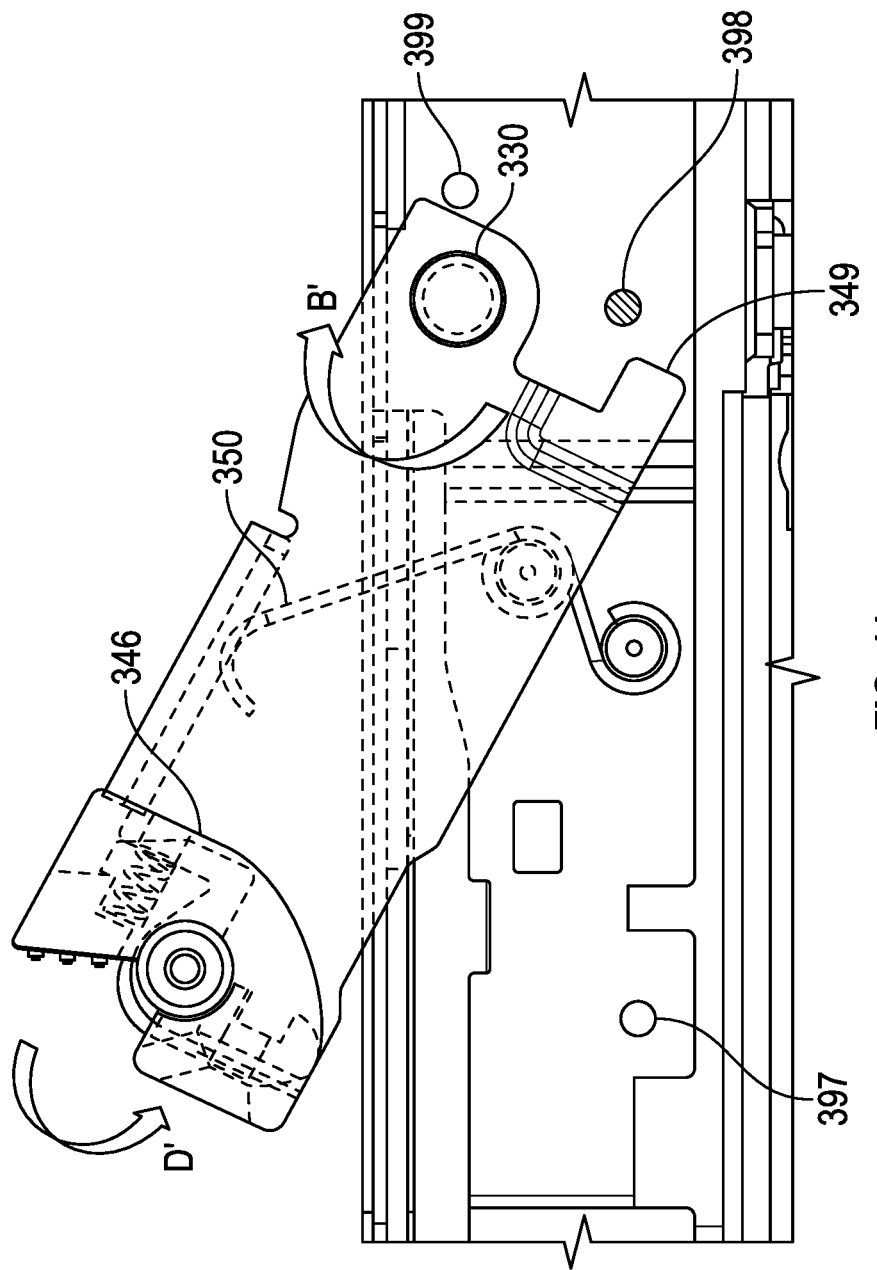
FIG. 11 is a side view of the latch mechanism of FIG. 10, including hidden features, after the rotary latch is unlocked to allow the expansion card assembly to be removed from a computer chassis, according to some implementations of the present disclosure.

Referring now to FIGS. 10 and 11, a side view of the latch mechanism 340 of FIGS. 9A and 9B is depicted, as the latching end 344 is released to unlock an expansion card assembly from a computer chassis. This allows the latch mechanism 340 to be rotated to an opened position. The rotary latch 346 is urged in direction D causing the rotary latch 346 to rotate about the cylindrical shaft 380 and causing the biasing structure 390 to compress. The rotation of the rotary latch 346 also causes the notch 393 of the hook structure 392 to disengage from the second stop pin 397 to allow the latch mechanism 340 to move to the open position depicted in FIG. 4A. The biasing structure 350 (see, e.g., FIG. 11) then urges the lever 342 in an upward direction such that the stop member 349 dislodges from the first stop pin 398 and the latch mechanism 340 rotates in direction B' until the pinned end 348 (see FIGS. 3A, 4A, 5, and 6A) comes into contact with the third stop pin 399. Once the latch mechanism 340 is stopped by the third stop pin 399, the latch mechanism 340 is in a fully opened position. In addition, as the force applied in direction D ceases, the biasing structure 390 causes the rotary latch 346 to rotate in direction D' (see FIG. 11).

The implementations described above for FIGS. 1 to 11 are primarily in the context of a latch mechanism for securing an expansion card assembly in a computer chassis. However, the described latch mechanism is applicable to other types of expansion card assemblies having printed circuit boards or other high-performance computer components. The described latch mechanism and expansion card assembly have been presented by way of example only, and not limitation, and can include different combinations of the described elements.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A latch mechanism for securing an expansion card assembly in a computer chassis, the expansion card assembly including a peripheral frame defining an interior space configured to have a printed circuit board at least partially positioned therein, the latch mechanism comprising:

a lever including a latching end and a pinned end opposite the latching end, the latching end being rotatable about the pinned end between a closed position in a downward direction and an open position in an upward direction;
a stop member extending from the pinned end of the lever, the stop member configured to engage a lower surface of a first stop pin of the computer chassis when the latching end is in the closed position;
a rotary latch connected to the latching end, the rotary latch including a receiving chamber and a hook structure, the hook structure including a notch for receiving a second stop pin;
a first biasing structure extending from the lever into the receiving chamber, the first biasing structure configured to urge the rotary latch into a locked position, whereby to cause the hook structure of the rotary latch to engage a lower surface of the second stop pin to retain the lever in the closed position; and
a second biasing structure configured to urge the lever about the pinned end to the open position;
wherein the lever is configured to, when in the closed position, press the peripheral frame downwardly to securely connect the printed circuit board to a motherboard in the computer chassis.

2. The latch mechanism of claim 1, wherein the pinned end of the lever is configured to receive a first cylindrical shaft extending from a side structure of the expansion card assembly, the first cylindrical shaft at least partially connecting the lever to the side structure.

3. The latch mechanism of claim 2, wherein the lever rotates about the first cylindrical shaft.

4. The latch mechanism of claim 3, wherein rotation of the lever about the first cylindrical shaft is at least partially controlled by the second stop pin and a third stop pin protruding from a side structure of the expansion card assembly.

5. The latch mechanism of claim 4, wherein the notch is configured to receive the second stop pin.

6. The latch mechanism of claim 5, wherein the hook structure includes a chamfered end configured to engage the second stop pin.

7. The latch mechanism of claim 1, wherein the first stop pin fixedly protrudes from a chassis structure adjacent to the expansion card assembly.

8. The latch mechanism of claim 1, wherein the first biasing structure is configured to urge the rotary latch from an unlocked position to the locked position.

9. The latch mechanism of claim 1, wherein the first biasing structure is a coil spring.

10. The latch mechanism of claim 1, wherein the second biasing structure is a torsion spring.

11. The latch mechanism of claim 1, wherein the lever includes an angled portion along a top edge of the lever, the angled portion being in contact with the second biasing structure.

12. The latch mechanism of claim 1, wherein the rotary latch is connected to the lever with a second cylindrical shaft about which the rotary latch rotates.

13. An expansion card module for a computer chassis, the expansion card module comprising:
a peripheral frame defining an interior space;
a printed circuit board at least partially positioned within the interior space; and
a latch mechanism including
a lever with a latching end and a pinned end opposite the latching end, the latching end being rotatable about the pinned end between a closed position in a downward direction and an open position in an upward direction,
a stop member extending from the pinned end, the stop member configured to engage a lower surface of a first stop pin when the latching end is in the closed position,
a rotary latch connected to the latching end, the rotary latch including a receiving chamber and a hook structure, the hook structure having a notch for receiving a second stop pin,
a first biasing structure extending from the lever into the receiving chamber, the first biasing structure configured to urge the rotary latch into a locked position, whereby to cause the hook structure of the rotary latch to engage a lower surface of the second stop pin to retain the lever in the closed position, and
a second biasing structure configured to urge the lever about the pinned end to the open position,
wherein the lever is configured to, when in the closed position, press the peripheral frame downwardly to securely connect the printed circuit board to a motherboard in the computer chassis.

14. The expansion card module of claim 13, wherein the printed circuit board is a vertical printed circuit board.

15. The expansion card module of claim 14 further comprising a horizontal printed circuit board at least partially positioned within the interior space.

16. The expansion card module of claim 13, wherein the pinned end of the lever is configured to receive a first cylindrical shaft protruding from the peripheral frame, the first cylindrical shaft at least partially connecting the lever to the peripheral frame.

17. The expansion card module of claim 16, wherein rotation of the lever about the first cylindrical shaft is at least partially controlled by the second stop pin and a third stop pin protruding from the peripheral frame.

18. The expansion card module of claim 17, wherein the notch is configured to receive the second stop pin.

19. The expansion card module of claim 18, wherein the hook structure includes a chamfered end configured to engage the second stop pin.

20. The expansion card module of claim 13, wherein the first biasing structure is configured to urge the rotary latch from an unlocked position to the locked position.

* * * * *